(12) United States Patent
Song et al.

(10) Patent No.: US 9,543,026 B2
(45) Date of Patent: Jan. 10, 2017

(54) NONVOLATILE MEMORY DEVICE AND OPERATING METHOD THEREOF

(71) Applicant: SAMSUNG ELECTRONICS CO., LTD., Suwon-si, Gyeonggi-do (KR)

(72) Inventors: Jung-Ho Song, Suwon-si (KR); Minsu Kim, Hwaseong-si (KR); Il-Han Park, Suwon-si (KR); Su Chang Jeon, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/865,275

(22) Filed: Sep. 25, 2015

(65) Prior Publication Data
US 2016/0093388 A1 Mar. 31, 2016

(30) Foreign Application Priority Data

Sep. 29, 2014 (KR) ........................ 10-2014-0130236

(51) Int. Cl.
*G11C 7/10* (2006.01)
*G11C 16/24* (2006.01)
*G11C 16/26* (2006.01)

(52) U.S. Cl.
CPC ............... *G11C 16/24* (2013.01); *G11C 16/26* (2013.01); *G11C 2207/005* (2013.01)

(58) Field of Classification Search
CPC ... G11C 16/14; G11C 16/26; G11C 2207/005; G11C 7/10; G11C 7/1078; G11C 7/12; G11C 16/10
See application file for complete search history.

(56) References Cited

U.S. PATENT DOCUMENTS

| | | | |
|---|---|---|---|
| 7,224,624 B2 | 5/2007 | Lee et al. | |
| 7,286,406 B2 | 10/2007 | Lutze et al. | |
| 7,593,265 B2 | 9/2009 | Nguyen et al. | |
| 7,679,133 B2 | 3/2010 | Son et al. | |
| 7,692,977 B2 | 4/2010 | Kim et al. | |
| 7,889,566 B2 | 2/2011 | Kang | |
| 8,179,722 B2 * | 5/2012 | Huh | G11C 16/0483 365/185.12 |
| 8,208,308 B2 * | 6/2012 | Han et al. | G11C 11/5628 365/185.19 |

(Continued)

FOREIGN PATENT DOCUMENTS

| KR | 100805839 | 2/2008 |
|---|---|---|
| KR | 1020090119042 | 11/2009 |
| KR | 1020100046531 | 5/2010 |

*Primary Examiner* — Douglas King
(74) *Attorney, Agent, or Firm* — F. Chau & Associates, LLC

(57) ABSTRACT

An operating method of a nonvolatile memory device is provided. The nonvolatile memory device includes first and second page buffers, and first and second bit lines connected thereto, respectively. First and second latch nodes of the first page buffer are charged to have a voltage having a first level according to data stored in a first latch of the first page buffer. After the charging of the first latch node is started, a sensing node of the second page buffer is pre-charged. The sensing node is connected to the second bit line. Data stored in the first latch is dumped into a second latch of the first page buffer during the pre-charging of the sensing node of the second page buffer.

15 Claims, 16 Drawing Sheets

(56) References Cited

U.S. PATENT DOCUMENTS

| | | |
|---|---|---|
| 8,218,366 B2 | 7/2012 | Dong et al. |
| 8,310,891 B2 | 11/2012 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,726,104 B2 | 5/2014 | Sharon |
| 9,165,672 B2* | 10/2015 | Kang et al. ............ G11C 7/1039 |
| 2005/0226046 A1* | 10/2005 | Lee ...................... G06F 12/0893 |
| | | 365/185.12 |
| 2006/0209605 A1* | 9/2006 | Won ...................... G11C 7/1051 |
| | | 365/203 |
| 2010/0329032 A1* | 12/2010 | Lim ...................... G11C 11/5628 |
| | | 365/185.22 |
| 2011/0199829 A1* | 8/2011 | Lee ...................... G11C 16/0483 |
| | | 365/185.17 |
| 2011/0233648 A1 | 9/2011 | Seol et al. |

\* cited by examiner

(12) United States Patent

NONVOLATILE MEMORY DEVICE AND OPERATING METHOD THEREOF

CROSS-REFERENCE TO RELATED APPLICATION

This application claims priority under 35 U.S.C. §119 to Korean Patent Application No. 10-2014-0130236, filed on Sep. 29, 2014 in the Korean Intellectual Property Office, the disclosure of which is incorporated by reference herein in its entirety.

TECHNICAL FIELD

The present inventive concept relates to a nonvolatile memory device and an operating method thereof.

DISCUSSION OF RELATED ART

With the advancement of the semiconductor fabrication technology, the capacity of nonvolatile memories continue to increase. In addition, storage capacity of nonvolatile memories increase by storing at least two or more bits per a memory cell. However, the increase in the number of bits to be stored per one memory cell necessitates an additional operation upon reading data from the memory cell or programming of data at the memory cell, and thus operating speed of the nonvolatile memory may be reduced.

SUMMARY

According to an exemplary embodiment of the present inventive concept, an operating method of a nonvolatile memory device is provided. The nonvolatile memory device includes first and second page buffers, and first and second bit lines connected thereto, respectively. First and second latch nodes of the first page buffer are charged to have a voltage having a first level according to data stored in a first latch of the first page buffer. After the charging of the first latch node is started, a sensing node of the second page buffer is pre-charged. The sensing node is connected to the second bit line. Data stored in the first latch is dumped into a second latch of the first page buffer during the pre-charging of the sensing node of the second page buffer.

According to an exemplary embodiment of the present inventive concept, an operating method of a nonvolatile memory device is provided. The nonvolatile memory device includes first and second page buffers, and first and second bit lines connected thereto, respectively. First and second latch nodes of the first page buffer are charged to a voltage of a first level, according to data stored in a second latch of the first page buffer. After the charging of the first and second latch nodes is started, a sensing node of the second page buffer is pre-charged. The sensing node is connected to the second bit line. Data stored in the second latch of the first page buffer is dumped into a first latch of the first page buffer during the pre-charging of the sensing node.

According to an exemplary embodiment of the present inventive concept, a semiconductor device is provided. A first node is coupled to a first latch. A second node is coupled to a second latch. A first transistor is interposed between the first node and a ground terminal. A voltage level of the first node, if the first transistor turns on, is pulled down to a ground level, and the voltage level of the first node, if the first transistor turns off, is driven to a voltage level according to data stored in the first latch. A second transistor is interposed between the first node and second node. The second transistor, if turns on, electrically connects the first node and the second node so that the first and second nodes have substantially the same voltage. A first bit line control unit is interposed between a first bit line and the second node, pre-charging the first bit line. A control logic starts charging of the first node before starting a pre-charging of the first bit line through the first bit line control unit.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
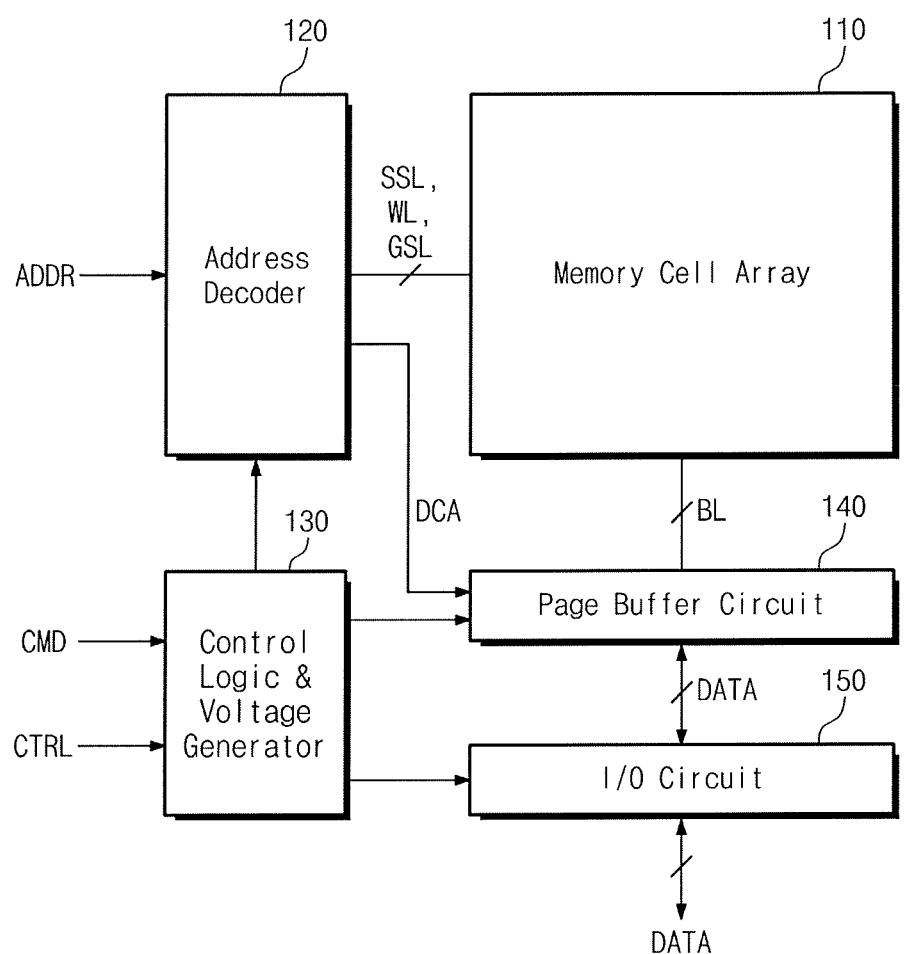
FIG. 1 is a block diagram of a nonvolatile memory device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram of a nonvolatile memory device according to an exemplary embodiment of the present inventive concept. Referring to FIG. 1, a nonvolatile memory device 100 contains a memory cell array 110, an address decoder 120, a control logic and voltage generator block 130, a page buffer circuit 140, and an input/output circuit 150.

The memory cell array 110 contains a plurality of memory blocks. Each memory block are formed to have a two-dimensional cell structure. Alternatively, each memory block may be formed to have a three-dimensional structure where the memory cells are stacked in a direction perpendicular to a substrate. Each of the memory blocks includes a plurality of strings each having a plurality of memory cells. The memory cells may be connected to a plurality of word lines. Each of the memory cells may be a single level cell (SLC) storing one bit or a multi-level cell (MLC) storing at least two bits.

The address decoder 120 is connected to the memory cell array 110 through word lines WL, a string selection line SSL, and a ground selection line GSL. When the memory cell array 110 is three-dimensionally formed, the address decoder 120 may be connected to the memory cell array 110 through word lines WL, string selection lines SSL, and ground selection lines GSL. The address decoder 120 receives an address ADDR from an external device (e.g., memory controller, host, or application processor). The address decoder 120 decodes the input address ADDR to select at least one of the word line WL. The address decoder 120 controls voltages of the word lines WL to perform a read or write operation with respect to a selected word line. For example, the address decoder 120 decodes a column address of the input address and transmits a decoded column address DCA to the page buffer circuit 140. The page buffer circuit 140 controls bit lines BL based on the decoded column address DCA.

The control logic and voltage generator block 130 receives a command CMD and a control signal CTRL from the external device and controls the address decoder 120, the page buffer circuit 140, and the input/output circuit 150 in response to the input signals. For example, the control logic and voltage generator block 130 controls the address decoder 120, the page buffer circuit 140, and the input/output circuit 150 in response to the command CMD and the control signal CTRL such that data is written to the memory cell array 110. The control logic and voltage generator block 130 also controls the address decoder 120, the page buffer circuit 140, and the input/output circuit 150 in response to the command CMD and the control signal CTRL such that data stored in the memory cell array 110 is output. The control logic and voltage generator block 130 controls the address decoder 120, the page buffer circuit 140, and the input/output circuit 150 in response to the command CMD and the control signal CTRL such that a portion of the memory cell array 110 is erased.

The control logic and voltage generator block 130 generates various voltages needed for the nonvolatile memory device 100 to operate. For example, the control logic and voltage generator block 130 may generate a plurality of read voltages, a plurality of verification read voltages, a plurality of program voltages, a plurality of pass voltages, a plurality of erase voltages, and so on and may transfer them to the address decoder 120.

The page buffer circuit 140 is connected to the memory cell array 110 through a plurality of bit lines BL. The page buffer circuit 140 temporarily stores data read from the memory cell array 110 or data to be written to the memory cell array 110.

The page buffer circuit 140 may include a plurality of latches. The latches may temporarily store data. The latches may perform a dumping operation about the data. The dumping operation may be executed when a bit line pre-charging operation is being performed. For example, the control logic and voltage generator block 130 may operate such that the dumping operation is executed when voltage biasing of latch nodes connected to the latches (bit line pre-charging operation) is being performed.

Under a control of the control logic and voltage generator block 130, the input/output circuit 150 provides the page buffer circuit 140 with data received from the external device. Under a control of the control logic and voltage generator block 130, the input/output circuit 150 outputs data received from the page buffer circuit 140 to the external device.

For example, upon programming of the nonvolatile memory device 100, data to be programmed to the memory cell array 110 may be temporarily stored in the page buffer circuit 140. The nonvolatile memory device 100 may execute a plurality of program loops to program data stored in the page buffer circuit 140 connected to the memory cell array 110. Each of the program loops may include a program step where a program pulse is applied and a verification step where a verification voltage is applied.

For example, the nonvolatile memory device 100 may set a program state (or, threshold voltage distribution) of memory cells, based on data stored at the page buffer circuit 140. In exemplary embodiments, the nonvolatile memory device 100 may set a target program state (or target threshold voltage distribution) of memory cells based on predetermined bit ordering. The nonvolatile memory device 100 may execute program loops such that each of the memory cells has the target program state.

Figure 2:
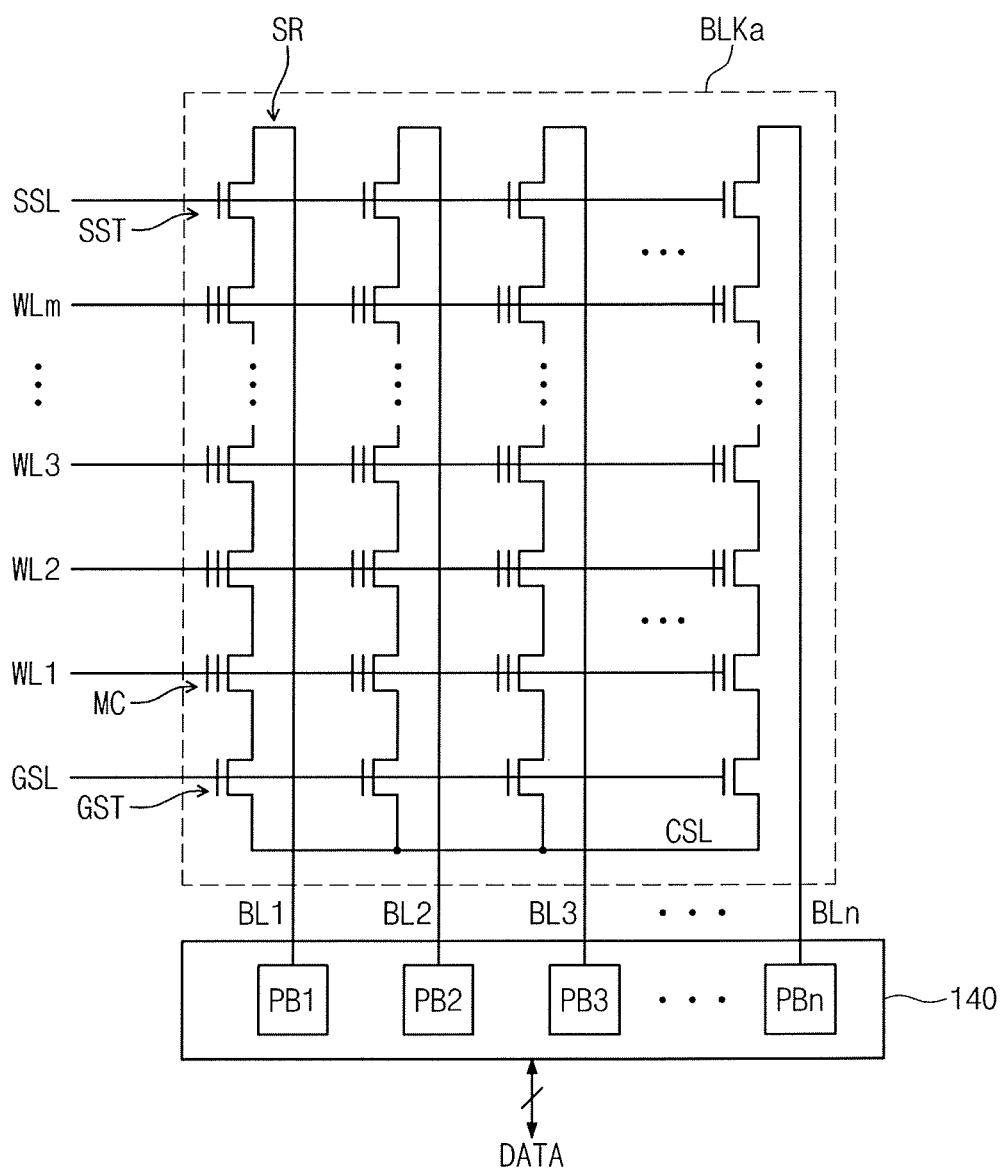
FIG. 2 is a circuit diagram of a memory block BLKa according to an exemplary embodiment of the present inventive concept.

FIG. 2 is a circuit diagram schematically illustrating a memory block BLKa according to an exemplary embodiment of the present inventive concept. Referring to FIGS. 1 and 2, a memory block BLKa includes a plurality of strings SR, which are connected to a plurality of bit lines BL1 through BLn, respectively. Each string SR contains a ground selection transistor GST, memory cells MC, and a string selection transistor SST. Although not shown in figures, when a memory cell array 110 is three-dimensionally formed, bit lines BL may be connected to a plurality of strings SR that are connected with different string selection lines SSL.

In each string SR, the ground selection transistor GST is connected between the memory cells MC and a common source line CSL. The ground selection transistors GST of the strings SR are connected in common to the common source line CSL.

In each string SR, the string selection transistor SST is connected between the memory cells MC and a bit line BL. The string selection transistors SST of the strings SR are connected to a plurality of bit lines BL1 through BLn, respectively.

In each string SR, the memory cells MC are connected between the ground selection transistor GST and the string selection transistor SST. In each string SR, the memory cells MC are connected in series.

In the strings SR, memory cells MC having the same height from the common source line CSL are connected in common to a word line. The memory cells MC of the strings SR are connected to a plurality of word lines WL1 through WLm.

Programming and reading of memory cells MC may be performed in a unit of a word line, which may be referred to as a "page". Memory cells MC that are connected in common to a word line may be simultaneously programmed or read. The memory cells MC may be erased in a unit of a memory block. Memory cells MC of the memory block BLKa may be erased at substantially the same time. Alternatively, memory cells MC may be erased in a unit of a sub-block. The memory block BLKa is divided into a plurality of sub-blocks, and memory cells MC in one sub-block are simultaneously erased.

A page buffer circuit 140 includes a plurality of page buffers PB1 through PBn. The page buffers PB1 through PBn are respectively connected to the bit lines BL1 through BLn. The page buffer circuit 140 temporarily stores data read from the memory cell array 110 or data to be written at the memory cell array 110. For example, each of the page buffers PB1 through PBn may include a plurality of latches that temporarily store data.

Figure 3:
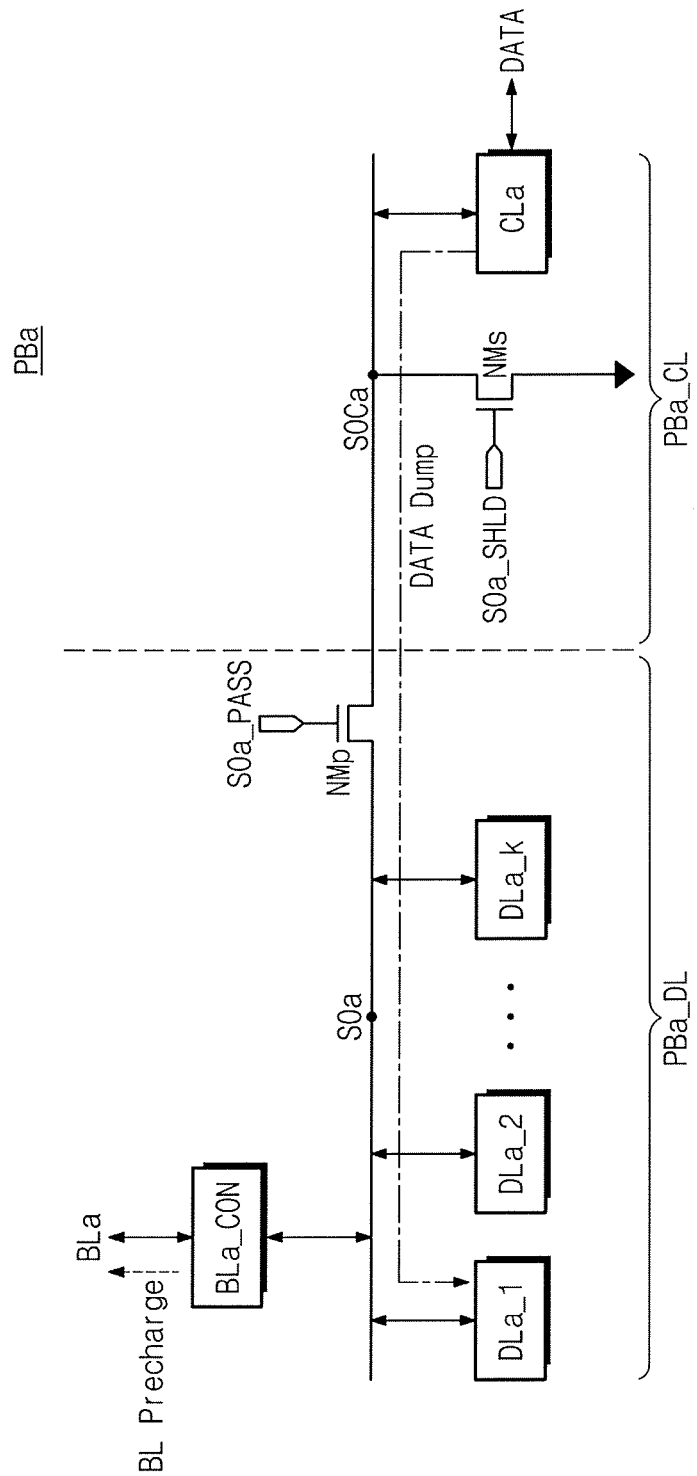
FIG. 3 is a block diagram of a page buffers in FIG. 2 according to an exemplary embodiment of the present inventive concept.

FIG. 3 is a block diagram of a page buffer in FIG. 2 according to an exemplary embodiment of the present inventive concept. Referring to FIG. 3, a page buffer PBa contains two latches: a data latch unit PBa_DL and a cache latch unit PBa_CL. The data latch unit PBa_DL includes a bit line control unit BLa_CON and at least one data latch DLa_1 through DLa_k. In an exemplary embodiment, the bit line control unit BLa_CON may be included in the control logic and voltage generator block 130 of FIG. 1. The cache latch unit PBa_CL includes at least one cache latch CLa. For the convenience of description, it is assumed that the data latch unit PBa_DL includes data latches DLa_1 through DLa_k and the cache latch unit PBa_CL includes a cache latch CLa. The cache latch CLa may be referred to as a "first latch", and a data latch DLa_1 to DLa_k may be referred to as a "second latch".

The data latches DLa_1 through DLa_k are connected to a data latch node SOa. The bit line control unit BLa_CON is connected to the data latch node SOa. The cache latch CLa is connected to a cache latch node SOCa. The cache latch node SOCa and the data latch node SOa are connected to each other through a pass transistor NMp. For example, the pass transistor NMp may be an n-type transistor. However, the present inventive concept is not limited thereto.

The cache latch CLa receives data. The received data is transferred to each of the data latches DLa_1 through DLa_k through a data dump operation. The received data is dumped from the cache latch CLa to the data latch DLa_1 through the data dump operation. However, the data dump operation may be performed to transfer data from the cache latch CLa to each of the data latches DLa_1 through DLa_k. Also, the data dump operation may be performed to transfer data from each of the data latches DLa_1 through DLa_k to the cache latch CLa. The data dump operation may be carried out when the pass transistor NMp is turned on in response to a high-level pass signal SOa_PASS.

The bit line control unit BLa_CON pre-charges a bit line BLa when the data dump operation is being performed. This operation may be referred to as a "bit line pre-charging operation". The bit line pre-charging operation may be performed in a read, program, or a verification operation.

The cache latch node SOCa is pulled down to a ground level through a shield transistor NMs. The cache latch node SOCa is reset to a low level if the shield transistor NMs is turned on in response to a high-level shield signal SOa_SHLD and the cache latch node SOCa is pulled down to the ground level.

The control logic and voltage generator block 130 may control the data latches DLa_1 through DLa_k and the cache latch CLa, respectively. The control logic and voltage generator block 130 may control the data dump operation and the bit line pre-charging operation. For example, the control logic and voltage generator block 130 may control timing of the bit line pre-charging operation and the data dump operation.

In an exemplary embodiment, the first latch node SOCa and second latch node SOa have different resistive-capacitive (RC) delays. For example, RC delay of the first latch node may be greater than RC delay of the second latch node.

Figure 4:
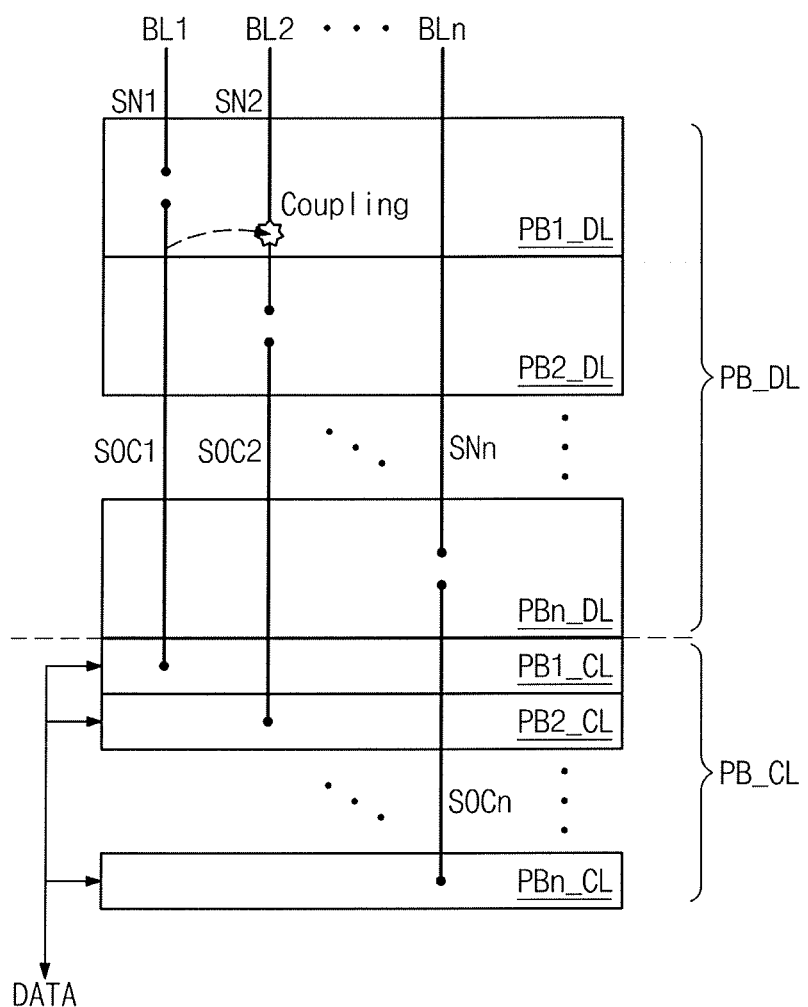
FIG. 4 is a diagram of physical arrangement of a page buffer circuit in FIG. 2 according to an exemplary embodiment of the present inventive concept.

FIG. 4 shows physical arrangement of a page buffer circuit of FIG. 2 according to an exemplary embodiment. Referring to FIGS. 2 through 4, a page buffer circuit 140 contains a plurality of page buffers PB1 through PB2. An area where the page buffer circuit 140 is formed is divided into a data latch area PB_DL and a cache latch area PB_CL. As described with reference to FIG. 3, each page buffer includes a data latch unit and a cache latch unit. Data latch units PB1_DL through PBn_DL are disposed in the data latch area PB_DL. Cache latch units PB1_CL through PBn_CL are disposed in the cache latch area PB_CL.

Data latch units or cache latch units of any other page buffers may be disposed between the data latch unit and the cache latch unit of each page buffer. For example, the second through n-th data latch units PB2_CL through PBn_DL are placed between the first data latch unit PB1_CL and the first cache latch unit PB1_CL. The third through n-th data latch units PB3_DL through PBn_DL, and the first cache latch unit PB1_CL are disposed between the second data latch unit PB2_DL and the second cache latch unit PB2_CL. The first through n−1$^{th}$ cache latch units PB1_CL through PBn−1_CL are disposed between the n-th data latch unit PBn_DL and the n-th cache latch unit PBn_CL.

The data latch units PB1_DL through PBn_DL may be connected to bit lines BL1 through BLn via sensing nodes SN1 through SNn. The data latch units PB1_DL through PBn_DL may be connected to the cache latch units PB1_CL through PBn_CL via cache latch nodes SOC1 through SOCn.

If a data dump operation are conducted when a bit line pre-charging operation is being performed, coupling between a sensing node SN and a cache latch node SOC that are adjacent to each other may affect a pre-charge voltage of the sensing node SN. For example, coupling occurs between a sensing node SN2 and a cache latch node SOC1 when the data dump operation is conducted while the bit line pre-charging operation is performed through the sensing node SN2. The coupling may occur between all adjacent sensing and cache latch nodes.

Figure 5:
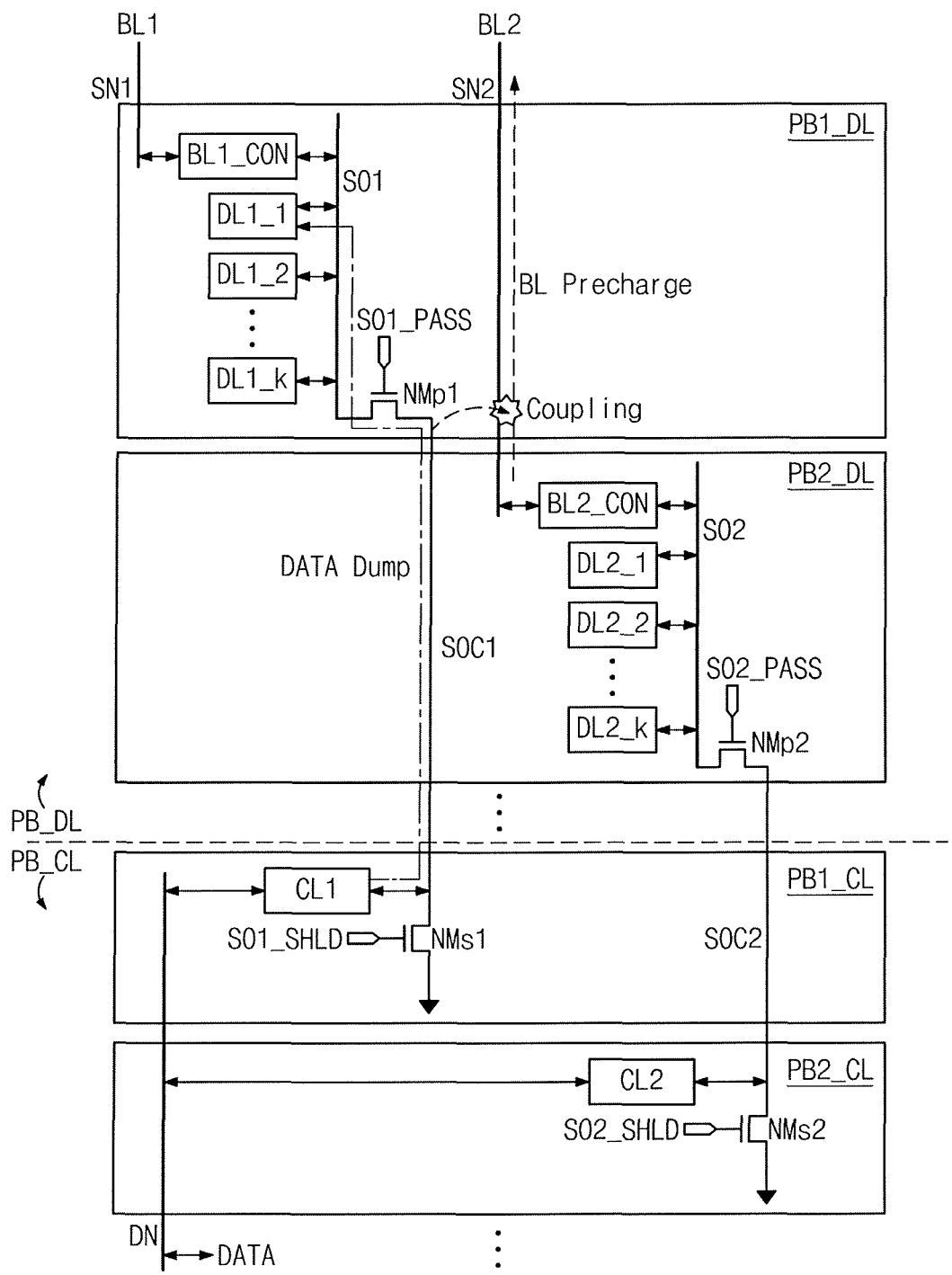
FIG. 5 is a diagram of sensing and cache latch nodes of FIG. 4 according to an exemplary embodiment of the present inventive concept.

FIG. 5 is a diagram of sensing and cache latch nodes of FIG. 4. Referring to FIG. 5, a second bit line control unit BL2_CON pre-charges a second bit line BL2 through a second sensing node SN2. On this occasion, a first cache latch unit PB1_CL performs a data dump operation through a first cache latch node SOC1 at substantially the same time. During the data dump operation, data is transferred from a cache latch CL1 of a first page buffer to a first data latch DL1_1 of the first page buffer. At this time, coupling occurs between the second sensing node SN2 and the first cache latch node SOC1. Data is transferred to first and second cache latches CL1 and CL2 through a data node DN.

Figure 6:
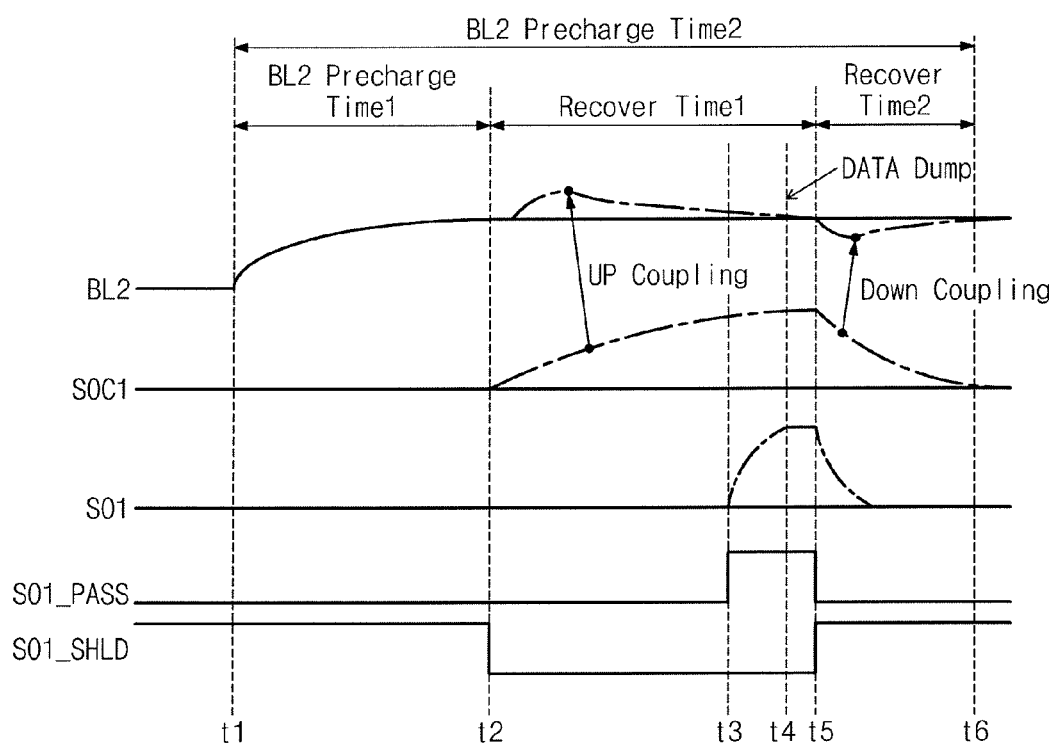
FIG. 6 is a timing diagram of operating a page buffer circuit of FIG. 5 according to an exemplary embodiment of the present inventive concept.

FIG. 6 is a timing diagram of operating a page buffer circuit shown in FIG. 5. Referring to FIGS. 5 and 6, a voltage of a second bit line BL2 may be influenced by a first cache latch node SOC1 due to coupling. Such coupling may increase a pre-charge time of the second bit line BL2.

Before time t1, a first shield signal SO1_SHLD has a high level. Thus, the first cache latch node SOC1 is pulled down to a low level. For example, the low level may be a ground level. At time t1, a second bit line control unit BL2_CON starts to pre-charge the second bit line BL2.

At time t2, since the first shield signal SO1_SHLD transitions from a high level to a low level, a first shield transistor NMs1 is turned off. On this occasion, a low-level voltage of the first cache latch node SOC1 is maintained or changed into a high-level voltage, according to data stored at a cache latch CL1 of a first page buffer. If a voltage of the first cache latch node SOC1 is changed into a high-level voltage, the second bit line BL2 suffers up-coupling as illustrated in FIG. 6. At time t3, a first pass transistor NMp1 is turned on because a first pass signal SO1_PASS transitions from a low level to a high level. On this occasion, a low-level voltage of the first data latch node SO1 is maintained or changed into a high-level voltage, according to data stored in the cache latch CL1 of the first page buffer. A data dump operation is executed at time t4 to transfer data from the cache latch CL1 of the first page buffer to a first data latch DL1_1 of the first page buffer. In an exemplary embodiment, the SO1_PASS and SO1_SHLD signals may be generated from the control logic & voltage generator 130 of FIG. 1 according to controls of a peripheral circuit.

At time t5, the first pass transistor NMp1 is turned off because the first pass signal SO1_PASS transitions from a high level to a low level. On this occasion, a low-level voltage of the first data node SO1 is maintained or changed. Also, the first shield transistor NMs1 is turned on because the first shield signal SO1_SHLD transitions from a low level to a high level. On this occasion, the voltage of the first cache latch node SOC1 is pulled down to a low level. For example, if the voltage of the first cache latch node SOC1 is low level, the low level is maintained. If the voltage of the first cache latch node SOC1 is high level, the high level is pulled down to low level (or ground level) through the first shield transistor NMs1. In this case, the second bit line BL2 suffers down-coupling when the voltage of the first cache latch node SOC1 is changed from high level to low level.

For the convenience of description, FIG. 6 shows that the second bit line BL2 suffers up-coupling between t2 and t3, and suffers down-coupling between t5 and t6. In this case, the second bit line BL2 is pre-charged during a second pre-charge time including first and second recovery times. Without the up-coupling and down-coupling of the second bit line BL2, a bit line is pre-charged in a first pre-charge time Time 1 without additional times Recover Time 1 and Recover Time 2. Accordingly, an operating time of a non-volatile memory device 100 is shortened by eliminating additional times.

Figure 7:
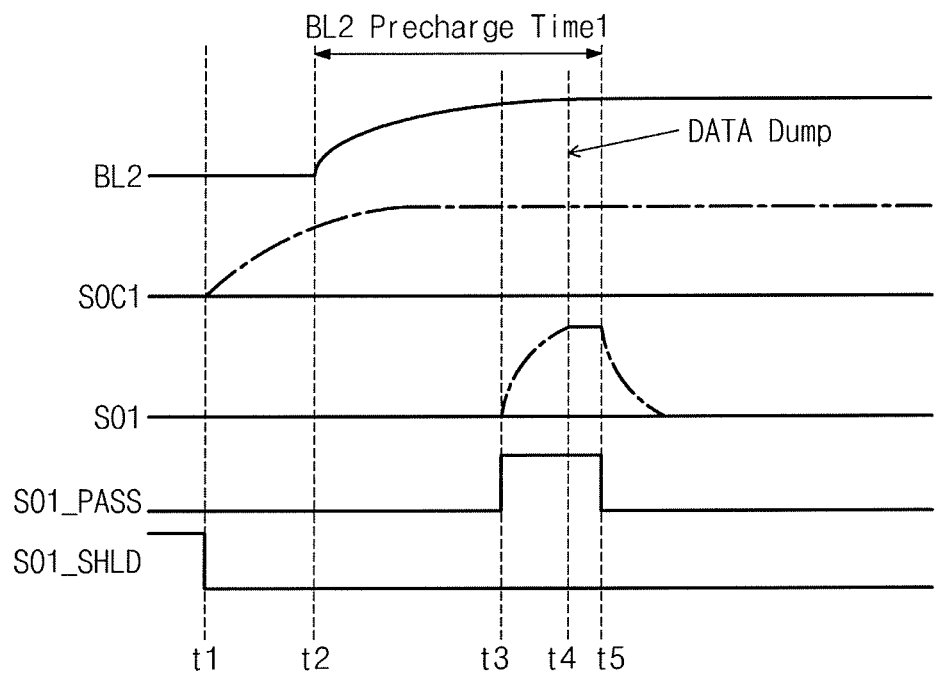
FIG. 7 is a timing diagram of operating a page buffer according to an exemplary embodiment of the present inventive concept.

FIG. 7 is a timing diagram of operating a page buffer according to an exemplary embodiment of the present inventive concept. Referring to FIGS. 5 and 7, a second bit line BL2 is pre-charged without coupling by preventing a voltage variation of a first cache latch node SOC1 after time t5.

Before time t1, a first shield signal SO1_SHLD has high level. Thus, the first cache latch node SOC1 has low level (or ground level). At time t1, the first shield signal SO1_SHLD transitions from high level to low level, turning off a first shield transistor NMs1. On this occasion, a low-level voltage of the first cache latch node SOC1 is maintained or changed into a high-level voltage, according to data stored at a cache latch CL1 of a first page buffer. At time t2, a second bit line control unit BL2_CON starts to pre-charge the second bit line BL2. At time t3, a first pass transistor NMp1 is turned on because a first pass signal SO1_PASS transitions from low level to high level. On this occasion, a low-level voltage of the first data latch node SO1 is maintained or changed into a high-level voltage, according to data stored at the cache latch CL1 of the first page buffer. At time t4, a data dump operation is executed to transfer data from the cache latch CL1 of the first page buffer to a first data latch DL1_1 of the first page buffer. At time t5, the first pass transistor NMp1 is turned off because the first pass signal SO1_PASS transitions from high level to low level. On this occasion, a low-level voltage of the first data latch node SO1 is maintained or changed.

Voltages of the first cache latch node SOC1 and the first data latch node SO1 are changed before-time t5. Thus, a voltage of the second bit line BL2 is not affected by the coupling with the first cache latch node SOC1 after time t5. Thus, the second bit line BL2 is pre-charged during a first pre-charge time (BL2 Precharge time 1). The first pre-charge time is shorter than a second pre-charge time (BL2 Pre-charge Time 2) shown in FIG. 6. A voltage of the first cache latch node SOC1 is not modified at an interval corresponding to a recovery time Recover Time1 of FIG. 6, and the voltage of the first cache latch node SOC1 is modified before or during the first pre-charge time (BL2 Precharge time 1).

Figure 8:
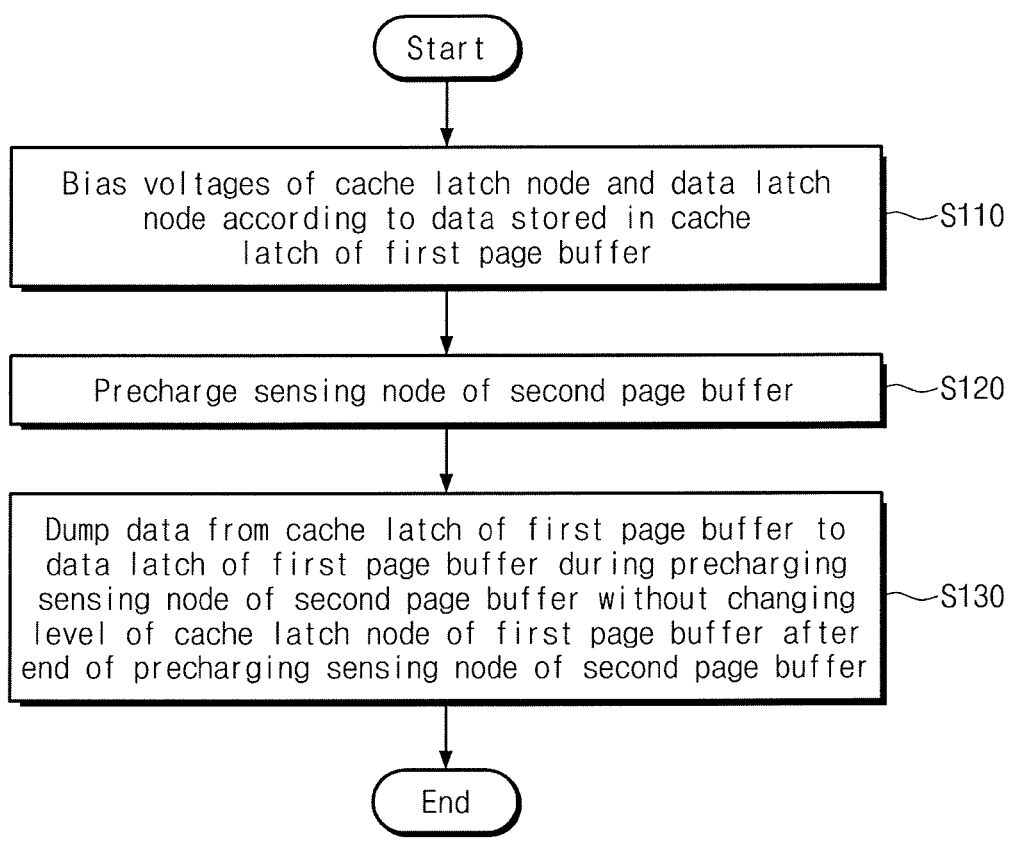
FIG. 8 is a flowchart of operating a page buffer circuit according to an exemplary embodiment of the present inventive concept.

FIG. 8 is a flowchart showing an operation of a page buffer circuit according to an exemplary embodiment of the present inventive concept. Referring to FIGS. 5, 7, and 8, after a pre-charging operation of a second bit line BL2 is completed, a voltage level of a first cache latch node SOC1 is maintained without variation. Thus, a second sensing node SN2 does not suffer coupling with the first cache latch node SOC1. A pre-charge time of the second bit line BL2 does not increase due to the coupling.

In step S110, the first cache latch node SOC1 and a first data latch node SO1 are biased according to data stored in a first cache latch CL1 of a first page buffer. For example, the first cache latch node SOC1 is charged with a predetermined voltage according to data stored at the first cache latch CL1. Afterwards, a first pass transistor NMp1 is turned on in response to a first pass signal SO1_PASS, and the first data latch node SO1 is charged with the predetermined voltage.

In step S120, a second sensing node SN2 of a second page buffer is pre-charged. For example, the sensing node SN2 may be pre-charged for a read, program, or verification operation.

In step S130, during pre-charging of the second sensing node SN2, data stored at the first cache latch CL1 is dumped from the first cache latch CL1 to a first data latch DL1_1 of the first page buffer. In the pre-charging of the second sensing node SN2, a voltage level of the second sensing node SN2 is not affected by coupling between the second sensing node SN2 and the first cache latch node SOC1. On this occasion, the second sensing node SN2 is not affected by the coupling with the first cache latch node SOC1, and thus a pre-charge time of the second bit line BL2 does not increase due to the coupling.

Figure 9:
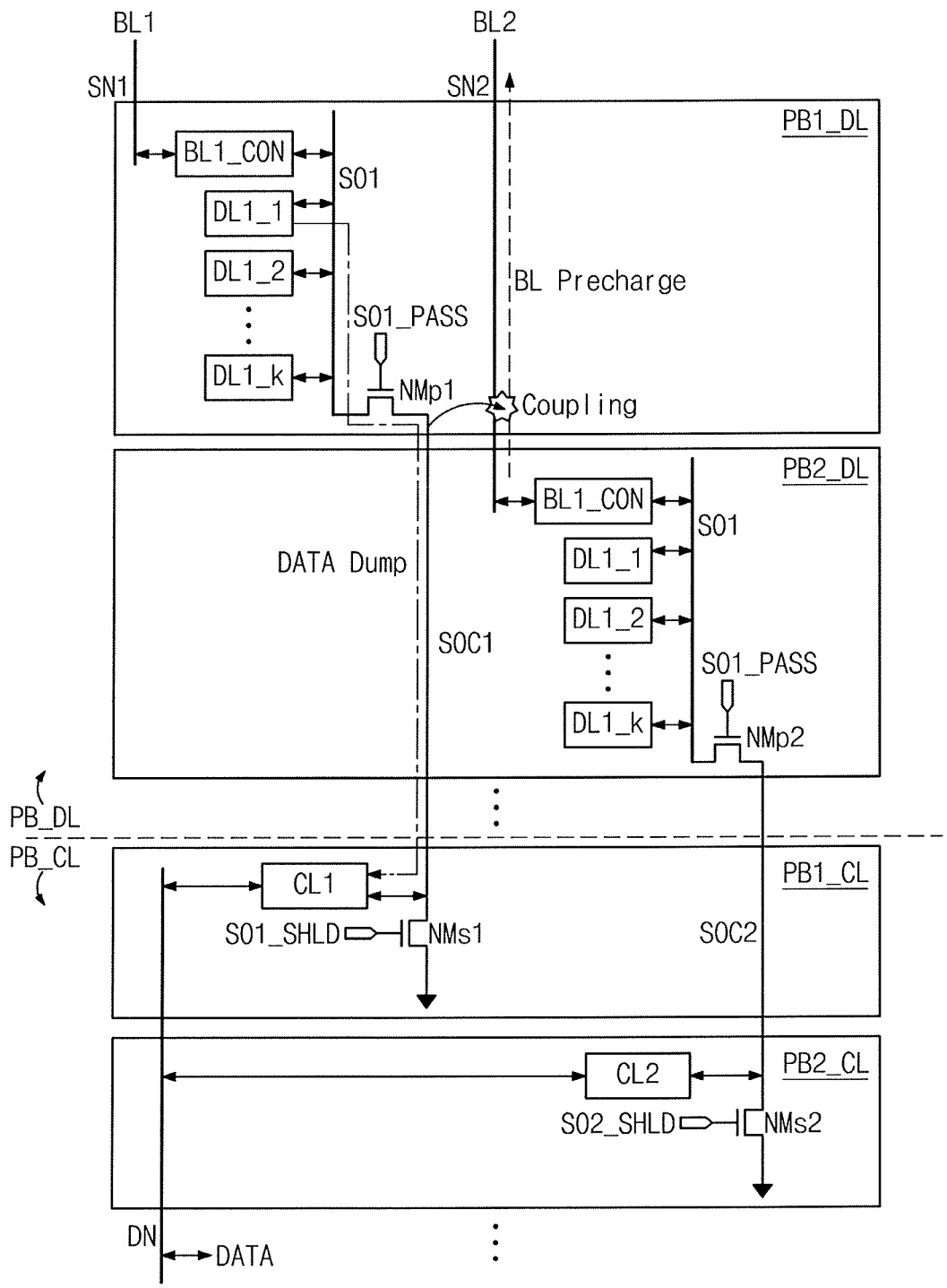
FIG. 9 is a diagram schematically illustrating another embodiment of adjacent sensing and cache latch nodes shown in FIG. 4.

FIG. 9 is a diagram of sensing and cache latch nodes shown in FIG. 4. Referring to FIG. 9, a second bit line control unit BL2_CON pre-charges a second bit line BL2 through a second sensing node SN2. On this occasion, a first data latch unit PB1_DL performs a data dump operation through a first cache latch node SOC1 at substantially the same time. During the data dump operation, data is transferred from a first data latch DL1 of a first page buffer to a first cache latch CL1 of the first page buffer. At this time, coupling occurs between the second sensing node SN2 and the first cache latch node SOC1. Data is output from first and second cache latches CL1 and CL2 through a data node DN.

Figure 10:
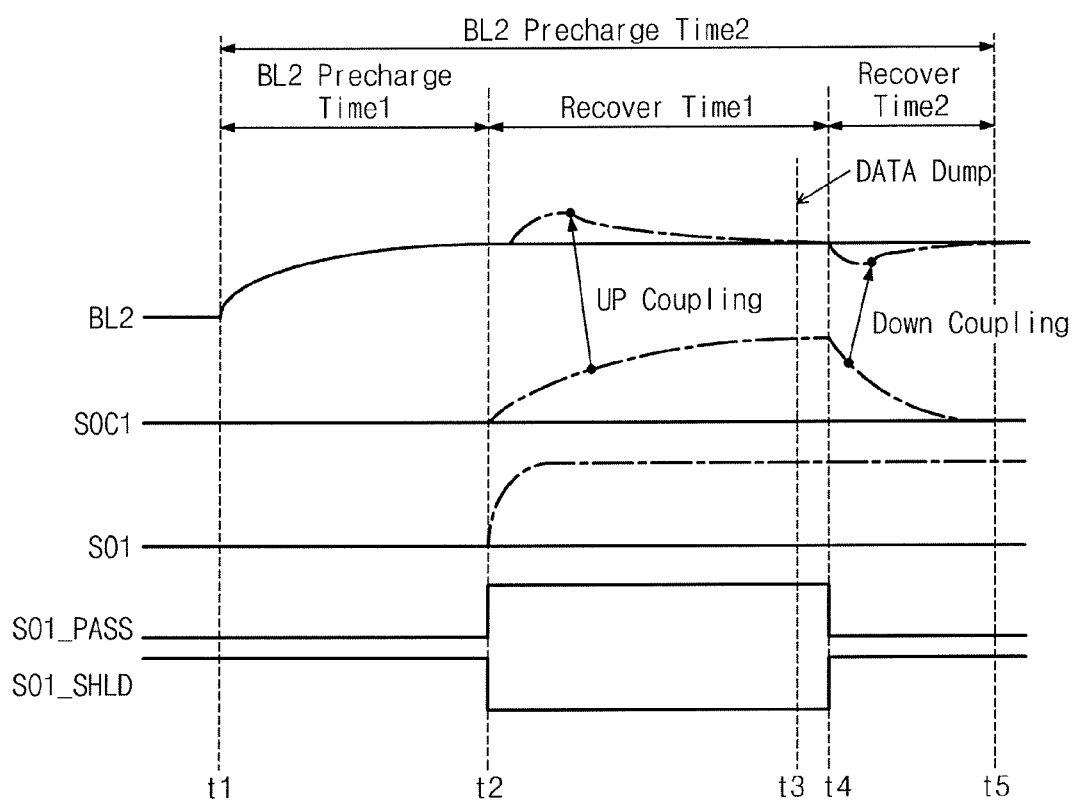
FIG. 10 is a timing diagram of operating a page buffer of FIG. 9 according to an exemplary embodiment of the present inventive concept.

FIG. 10 is a timing diagram of operating a page buffer circuit of FIG. 9. Referring to FIGS. 9 and 10, a voltage of a second bit line BL2 may be influenced by a first cache latch node SOC1 due to coupling, thereby increasing a pre-charge time of the second bit line BL2.

At time t1, a second bit line control unit BL2_CON starts to pre-charge the second bit line BL2. Before time t2, because a first shield signal SO1_SHLD has high level, a first cache latch node SOC1 is pulled down to low level. For example, the low level is ground level.

At time t2, a low-level voltage of the first cache latch node SOC1 is maintained or changed into a high-level voltage, according to data stored at a data latch DL1 of a first page buffer. If the first shield signal SO1_SHLD transitions from high level to low level, a first shield transistor NMs1 is turned off. On this occasion, a low-level voltage of the first cache latch node SOC1 is maintained or changed into a high-level voltage, if a first pass transistor NMp1 is turned on. At this time, the first pass signal SO1_PASS transitions from low level to high level. On this occasion, the first pass transistor NMp1 is turned on, and a low-level voltage of the first cache latch node SOC1 is maintained or changed into a high-level voltage, according to a voltage of the first data latch node SO1. If a voltage of the first cache latch node SOC1 is changed into a high-level voltage, the second bit line BL2 suffers up-coupling as illustrated in FIG. 10. At time t3, a data dump operation is executed to transfer data from the first data latch DL1_1 of the first page buffer to a first cache latch CL1 of the first page buffer.

At time t4, the first pass transistor NMp1 is turned off because the first pass signal SO1_PASS transitions from high level to low level. On this occasion, the first data node SO1 maintains a low-level voltage or a high-level voltage. Also, the first shield transistor NMs1 is turned on because the first shield signal SO1_SHLD transitions from low level to high level. On this occasion, the first cache latch node SOC1 is pulled down to low level (or ground level). The second bit line BL2 suffers down-coupling when a voltage of the first cache latch node SOC1 is changed from high level to low level.

As described above, the second bit line BL2 is affected by up-coupling between t2 and t3. Also, the second bit line BL2 is affected by down-coupling between t4 and t5. Thus, the pre-charged voltage of the second bit line BL2 is affected, and a recovery back to the original pre-charged voltage is necessary in the recovery times Recover Time 1 and Recover Time 2. Such recovery time increases a pre-charge time to a second precharge time Precharge Time 2. In contrast, the second bit line BL2 is pre-charged during a first pre-charge time Precharge Time 1 by preventing the second bit line BL2 from being affected by the up-coupling and down-coupling. Accordingly, an operating time of a nonvolatile memory device 100 need not be increased due to the coupling.

Figure 11:
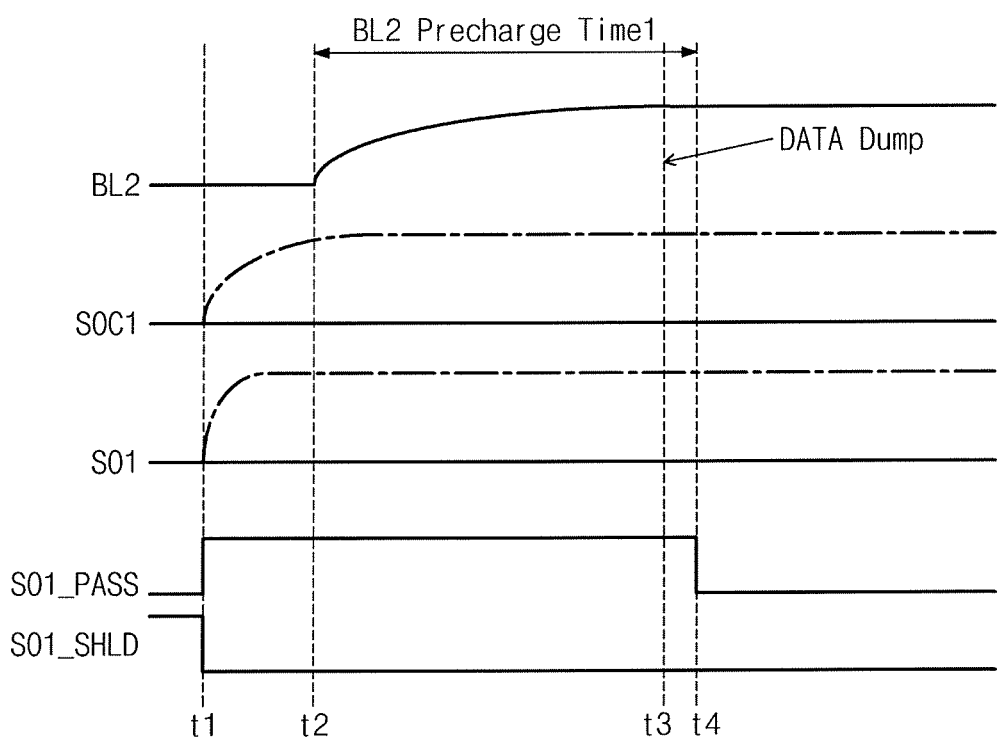
FIG. 11 is a timing diagram of operating a page buffer according to an exemplary embodiment of the present inventive concept.

FIG. 11 is a timing diagram of operating a page buffer according to an exemplary embodiment of the present inventive concept. Referring to FIGS. 9 and 11, a second bit line BL2 is pre-charged without being affected by coupling, and thus a voltage variation of a first cache latch node SOC1 is prevented after time t4.

Before time t1, a first shield signal SO1_SHLD has high level. Thus, the first cache latch node SOC1 has low level. At time t1, a low-level voltage of the first cache latch node SOC1 is maintained or changed into a high-level voltage, according to data stored at a first cache latch CL1 of a first page buffer. Since the first shield signal SO1_SHLD transitions from high level to low level, a first shield transistor NMs1 is turned off. On this occasion, a low-level voltage of the first cache latch node SOC1 is maintained or changed into a high-level voltage, if a first pass transistor NMp1 is turned on. At this time, a first pass signal SO1_PASS transitions from a low level to a high level. Thus, the first pass transistor NMp1 is turned on, and a low-level of the first cache latch node SOC1 is maintained or changed into a high-level voltage, according to a voltage of the first data latch node SO1.

At time t2, a second bit line control unit BL2_CON starts to pre-charge the second bit line BL2. At time t3, a data dump operation is executed to transfer data from a first data latch DL1_1 of the first page buffer to the first cache latch CL1. At time t4, the first pass signal SO1_PASS transitions from high level to low level. Thus, at time t4, the first pass transistor NMp1 is turned off because the first pass signal SO1_PASS transitions from a high level to a low level. On this occasion, the first data latch node SO1 maintains a low-level voltage or a high-level voltage. Also, the first cache latch node SOC1 maintains a low-level voltage or a high-level voltage.

Voltages of the first cache latch node SOC1 and the first data latch node SO1 are changed before the time t4. Thus, the second bit line BL2 is not affected by the coupling with the first cache latch node SOC1 after the time t4. Thus, the second bit line BL2 is pre-charged during a first pre-charge time (BL2 Precharge time). The first pre-charge time is shorter than a second pre-charge time (BL2 Precharge Time 2) shown in FIG. 9.

Figure 12:
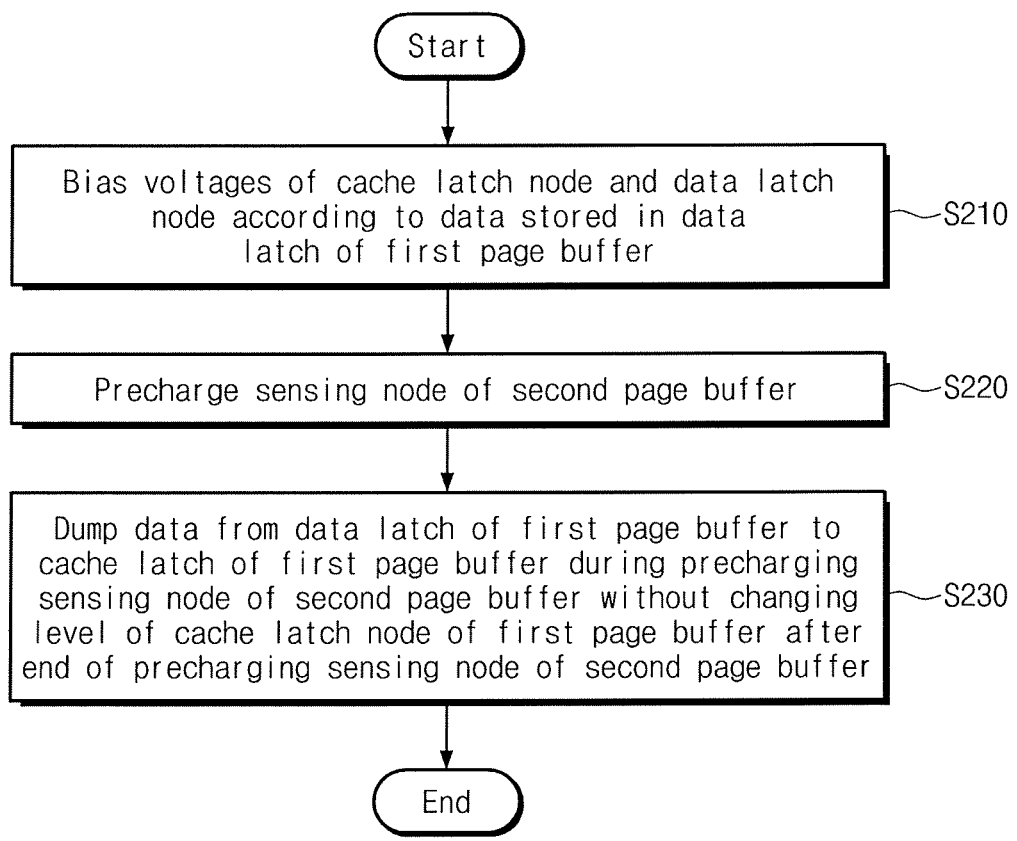
FIG. 12 is a flowchart of operating a page buffer circuit according to an exemplary embodiment of the present inventive concept.

FIG. 12 is a flowchart of operating a page buffer circuit according to an exemplary embodiment of the present inventive concept. Referring to FIGS. 5, 11, and 12, after a pre-charging operation of a second bit line BL2 is completed, a voltage level of a first cache latch node SOC1 is maintained without variation. Thus, a second sensing node SN2 is not affected by the coupling with the first cache latch node SOC1. A pre-charge time of the second bit line BL2 does not increase due to the coupling.

In step S210, the first cache latch node SOC1 and a first data latch node SO1 is biased according to data stored at a data latch DL1 of a first page buffer. For example, the first data latch node SO1 is biased with a predetermined voltage based on data stored in the first data latch DL1_1 of the first page buffer. If a first pass transistor NMp1 is turned on in response to a first pass signal SO1_PASS, the first cache latch node SOC1 is biased with the predetermined voltage.

In step S220, a second sensing node SN2 of a second page buffer is pre-charged. For example, the second sensing node SN2 may be pre-charged for a read, program, or verification operation.

In step S230, during the pre-charging of the second sensing node SN2, data stored in the first data latch DL1_1 of the first page buffer is dumped from the first data latch DL1_1 to a first cache latch CL1 of the first page buffer. After the second sensing node SN2 is pre-charged, a voltage level of the second sensing node SN2 is maintained without variation. On this occasion, the second sensing node SN2 is not affected by the coupling with the first cache latch node SOC1. Accordingly, a pre-charge time of the second bit line BL2 does not increase or is shortened as compared with when the second sensing node SN2 is affected by the coupling.

Figure 13:
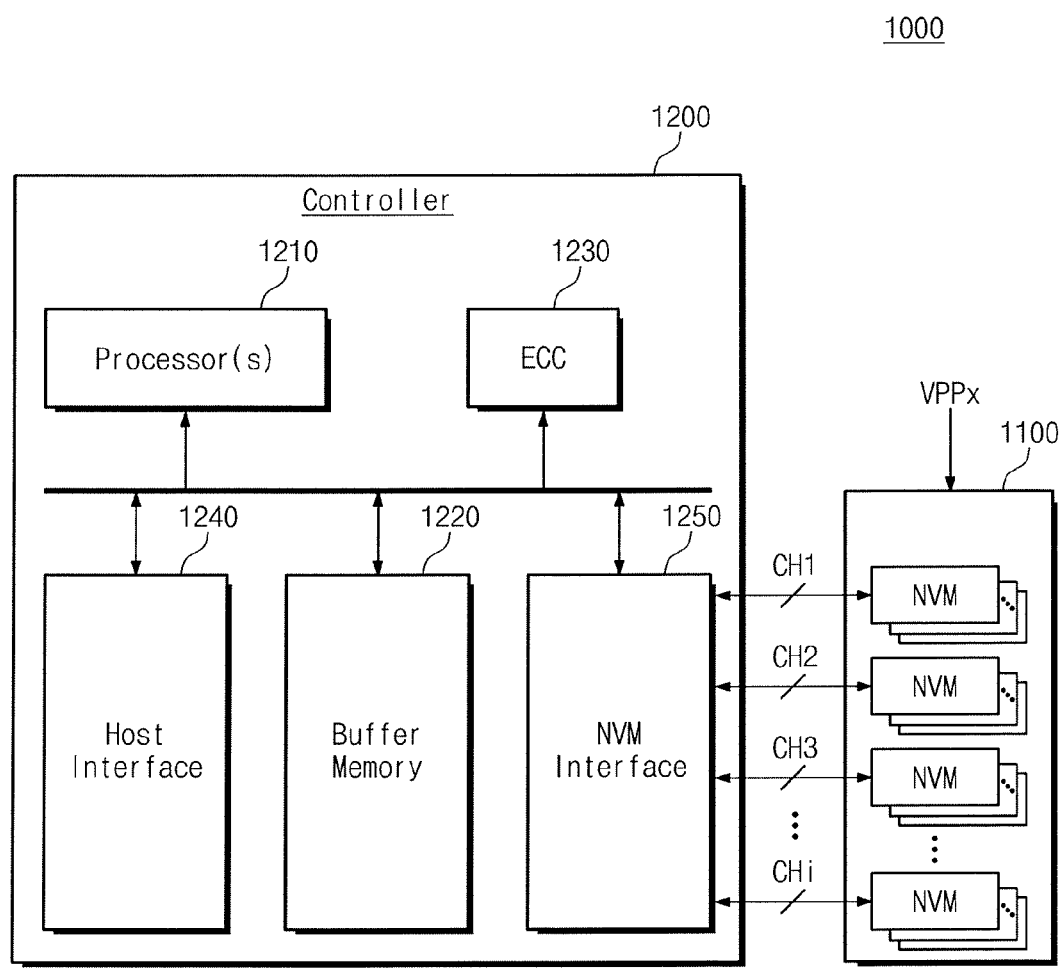
FIG. 13 is a block diagram of a solid state drive according to an exemplary embodiment of the present inventive concept.

FIG. 13 is a block diagram of a solid state drive according to an exemplary embodiment of the present inventive concept. Referring to FIG. 13, a solid state drive (hereinafter, referred to as SSD) 1000 includes a plurality of nonvolatile memory devices 1100 and an SSD controller 1200.

The nonvolatile memory devices 1100 may be optionally provided with an external high voltage VPPx. Each of the nonvolatile memory devices 1100 may reduce coupling between adjacent sensing and cache latch nodes of a page buffer circuit according to an exemplary embodiment. A pre-charge time of bit lines may be shortened as compared with when coupling affects a pre-charged voltage, and thus an operating speed may increase.

The SSD controller 1200 is connected to the nonvolatile memory devices 1100 through a plurality of channels CH1 through CHi (i being an integer of 2 or more). The SSD controller 1200 includes one or more processors 1210, a buffer memory 1220, an error correcting code (ECC) block 1230, a host interface 1240, and a nonvolatile memory interface 1250.

The buffer memory 1220 temporarily stores data needed to drive the SSD controller 1200. In exemplary embodiments, the buffer memory 1220 may include a plurality of memory lines each of which stores data or a command.

The ECC block 1230 is configured to calculate an ECC value of data to be programmed in a write operation, correct an error of read data according to an ECC value in a read operation, and correct an error of data read from the nonvolatile memory device 1100 in a data restoration operation. Although not shown in FIG. 13, a code memory may be further included to store code data needed to drive the SSD controller 1200. The code memory may be implemented with a nonvolatile memory device.

The host interface 1240 provides an interface with an external device. The host interface 1240 may be a NAND flash interface. Besides, the host interface 1240 may be implemented with various interfaces or with a plurality of interfaces. The nonvolatile memory interface 1250 provides an interface with the nonvolatile memory devices 1100.

The inventive concept is applicable to an eMMC (e.g., an embedded multimedia card, moviNAND, iNAND, etc.).

Figure 14:
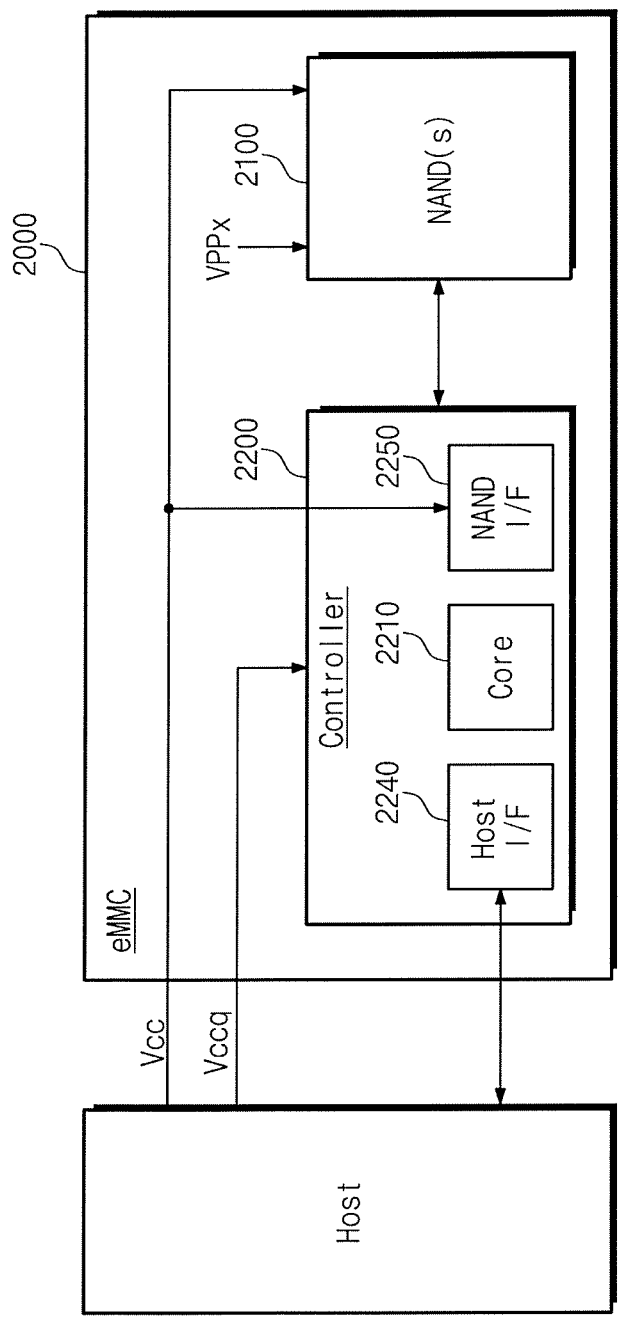
FIG. 14 is a block diagram of an eMMC according to an exemplary embodiment of the present inventive concept.

FIG. 14 is a block diagram of an eMMC according to an exemplary embodiment of the present inventive concept. Referring to FIG. 14, an eMMC 2000 includes one or more NAND flash memory devices 2100 and a controller 2200.

The NAND flash memory device 2100 may be a single data rate (SDR) or a double data rate (DDR) NAND. Alternatively, the NAND flash memory device 2100 may be a vertical NAND flash memory device (vertical NAND (VNAND)). The NAND flash memory device 2100 may reduce coupling between adjacent sensing and cache latch nodes of a page buffer circuit according to an exemplary embodiment to reduce a pre-charge time of bit lines and increase an operating speed as compared with when a pre-charged voltage is affected by coupling.

The controller 2200 is connected to the NAND flash memory device 2100 via a plurality of channels. The controller 2200 includes one or more controller cores 2210, a host interface 2240, and a NAND interface 2250. The controller core 2210 may control an overall operation of the eMMC 2000. The host interface 2240 is configured to perform an interface between the controller 2200 and a host. The NAND interface 2250 is configured to provide an interface between the NAND flash memory device 2100 and the controller 2200. In exemplary embodiments, the host interface 2250 may be a parallel interface (e.g., MMC interface). In other exemplary embodiments, the host interface 2240 of the eMMC 2000 may be a serial interface (e.g., UHS-II, UFS interface, etc.).

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The inventive concept is applicable to Universal Flash Storage (UFS).

Figure 15:
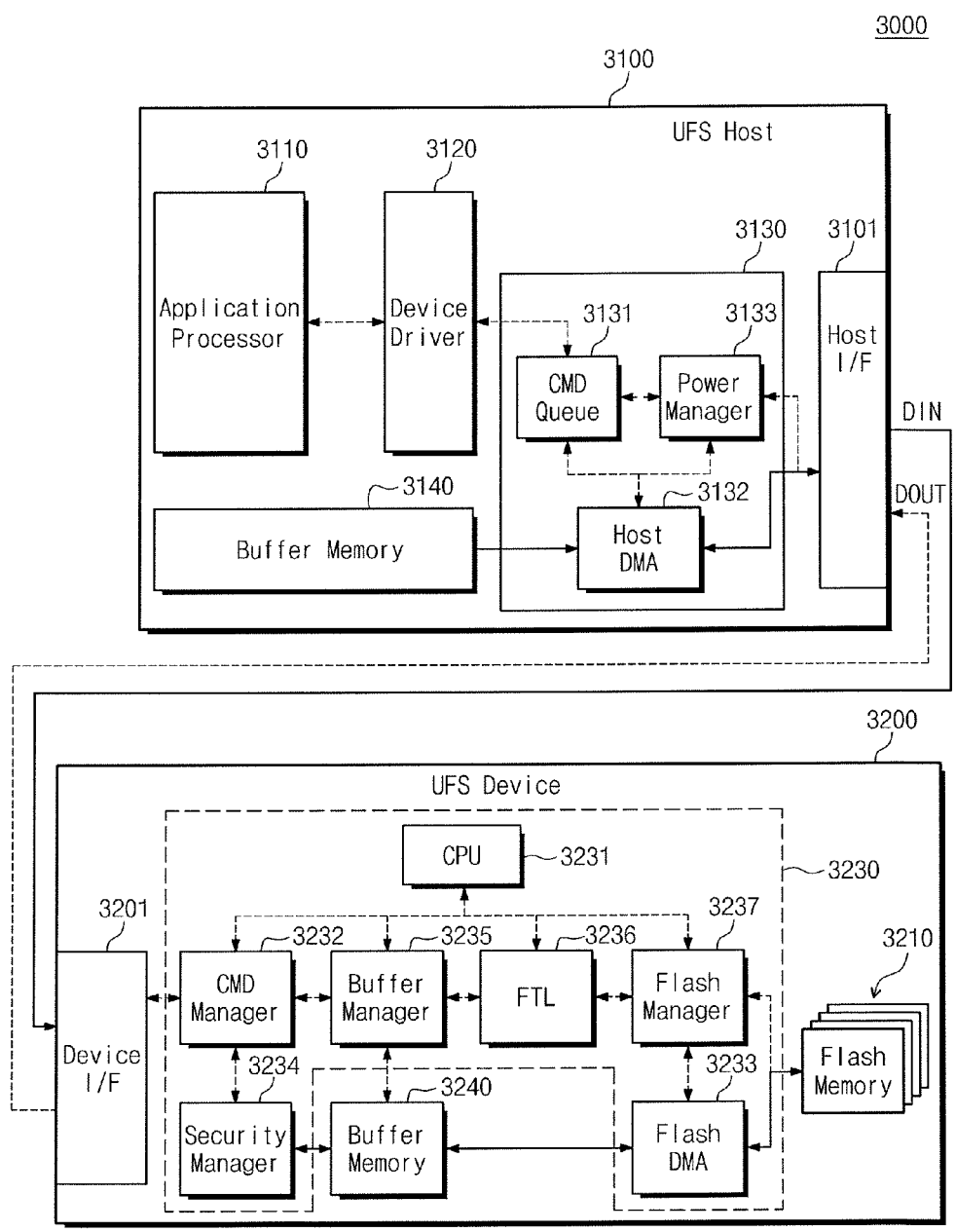
FIG. 15 is a block diagram of an UFS system according to an exemplary embodiment of the present inventive concept.

FIG. 15 is a block diagram of an UFS system. Referring to FIG. 15, an UFS system 3000 includes an UFS host 3100 and an UFS device 3200.

The UFS host 3100 includes an application processor 3110, a device driver 3120, a host controller 3130, and a buffer memory 3140. For example, the buffer memory 3140 may be formed of a random access memory (RAM). The host controller 3130 includes a command queue 3131, a host DMA 3132, and a power manager 3133. The command queue 3131, host direct memory access (DMA) 3132, and power manager 3133 may be implemented algorithm, software, or firmware that is executed in the host controller 3130.

Commands (e.g., a write command) generated by the UFS application processor 3110 and the device driver 3120 in the UFS host 3100 are managed by the command queue 3131 of the host controller 3130. The command queue 3131 manages commands to be provided sequentially to the UFS device 3200. Provided to the host DMA. 3132 are the commands that are stored in the command queue 3131. The host DMA 3132 sends the commands to the UFS device 3200 through a host interface 3101.

The UFS device 3200 includes a flash memory 3210, a device controller 3230, and a buffer memory 3240. For example, the buffer memory 3240 may be formed of a RAM. The device controller 3230 includes a Central Processing Unit (CPU) 3231, a command manager 3232, a flash DMA 3233, a security manager 3234, a buffer manager 3235, a flash translation layer (FTL) 3236, and a flash manager 3237. Herein, the command manager 3232, security manager 3234, buffer manager 3235, FTL 3236, and flash manager 3237 may be implemented with algorithm, software, or firmware that operates in the device controller 3230.

The flash memory device 3210 may reduce coupling between adjacent sensing and cache latch nodes of a page buffer circuit according to an exemplary embodiment. A pre-charge time of bit lines is reduced as compared with when a pre-charged voltage is affected by coupling, and an operating speed is increased.

A command transferred from the UFS host 3100 to the UFS device 3200 is provided to the command manager 3232 through a device interface 3201. The command manager 3232 analyzes a command provided from the UFS host 3100, and it authenticates the command by using the security manager 3234. The command manager 3232 allocates the buffer memory 3240 to receive data through the buffer manager 3235. The command manager 3232, if ready to transfer data, sends RTT (READY_TO_TRANSFER) UPIU to the UFS host 3100.

The UFS host 3100 sends data to the UFS device 3200 in response to the RTT UPIU. The data is sent to the UFS device 3200 through the host DMA 3132 and the host interface 3101. The UFS device 3200 stores the received data in the buffer RAM 3240 through the buffer manager 3235. The data stored in the buffer RAM 3240 is provided to the flash manager 3237 through the flash DMA 3233. The flash manager 3237 stores data at a selected address of the flash memory 3210, based on address mapping information of the FTL 3236.

If a data transfer operation and a program operation for a command are completed, the UFS device 3200 may send a response signal to the UFS host 3100 through an interface and may inform the UFS host 3100 of command completion. The UFS host 3100 informs the device driver 3120 and the application 3110 of whether a command corresponding to the response signal is processed, and then terminates an operation on the command.

The inventive concept is applicable to a mobile device.

Figure 16:
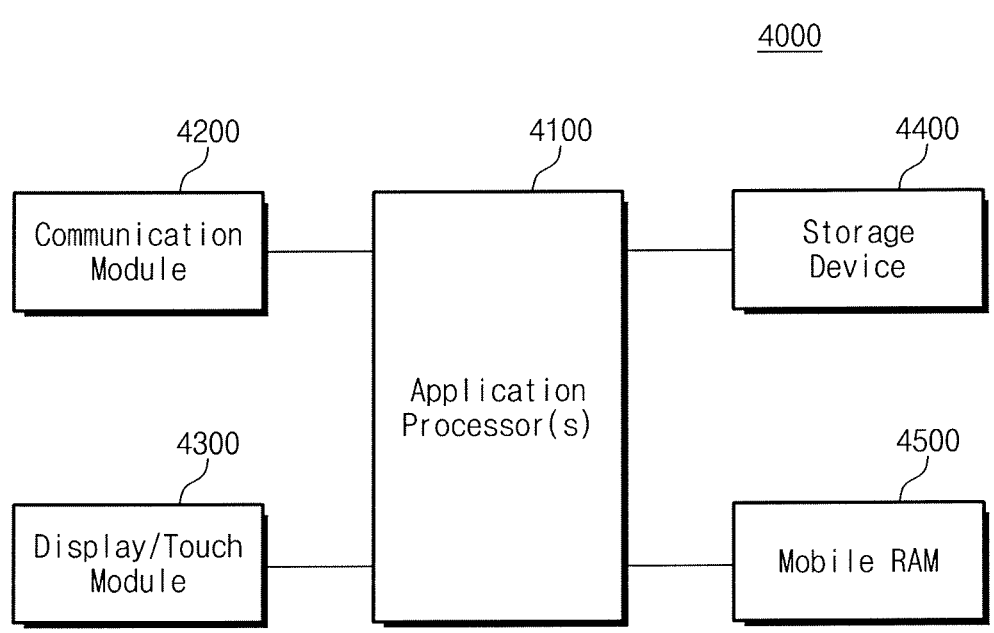
FIG. 16 is a block diagram of a mobile device according to an exemplary embodiment of the present inventive concept.

FIG. 16 is a block diagram of a mobile device according to an exemplary embodiment of the present inventive concept. Referring to FIG. 16, a mobile device 4000 includes an application processor 4100, a communication module 4200, a display/touch module 4300, a storage device 4400, and a mobile RAM 4500.

The application processor 4100 controls an overall operation of the mobile device 4000, and the communication module 4200 performs wireless/wire communications with an external device. The display/touch module 4300 is implemented to display data processed by the application processor 4100 or to receive data through a touch panel. The storage device 4400 is implemented to store user data. The storage device 4400 may be, but not limited to, an eMMC, an SSD, or an UFS device. The mobile RAM 4500 temporarily stores data needed for an operation of the mobile device 4000.

In an exemplary embodiment, the storage device 4400 may is less subject to coupling between adjacent sensing and cache latch nodes of a page buffer circuit as compared with when a pre-charged voltage is affected by coupling. A pre-charge time of bit lines may be reduced as when a pre-charged voltage is affected by coupling, and thus an operating speed may increase.

A memory system or a storage device according to exemplary embodiments of the inventive concept may be packaged according to a packaging technology including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An operating method of a nonvolatile memory device which includes first and second page buffers, and first and second bit lines connected thereto respectively, the operating method comprising:
   charging first and second latch nodes of the first page buffer to have a voltage of a first level according to data stored in a first latch of the first page buffer;
   after the charging of the first latch node is started, pre-charging a sensing node of the second page buffer, wherein the sensing node of the second page buffer is connected to the second bit line; and
   dumping data stored in the first latch into a second latch of the first page buffer during the pre-charging of the sensing node of the second page buffer.

2. The operating method of claim 1, wherein the charging of the first and second latch nodes includes:
   charging the first latch node to the first level, according to the data stored in the first latch; and
   charging the second latch node to the first level.

3. The operating method of claim 1, wherein the first latch node is connected to the first latch, the second latch node is connected to the second latch, and the first and second latch nodes are electrically connected through a transistor.

4. The operating method of claim 3, wherein the second latch node is charged with the first level if the transistor turns on after the pre-charging of the sensing node is started.

5. The operating method of claim 1, wherein the second bit line is pre-charged through the sensing node.

6. The operating method of claim 1, wherein the first latch node is electrically connected to a ground terminal through a transistor.

7. The operating method of claim 6, wherein the first latch node is pulled down to a ground voltage if the transistor turns on.

8. The operating method of claim 1, wherein RC delay of the first latch node is greater than RC delay of the second latch node.

9. An operating method of a nonvolatile memory device which includes first and second page buffers, and first and second bit lines connected thereto respectively, the operating method comprising:
   charging first and second latch nodes of the first page buffer to have a voltage of a first level, according to data stored in a second latch of the first page buffer;
   after the charging of the first and second latch nodes is started, pre-charging a sensing node of the second page buffer, wherein the sensing node is connected to the second bit line; and
   dumping data stored in the second latch of the first page buffer into a first latch of the first page buffer during the pre-charging of the sensing node.

10. The operating method of claim 9, wherein the charging of the first and second latch nodes includes:
    charging the second latch node to the first level, based on the data stored in the second latch; and
    charging the first latch node to the first level.

11. The operating method of claim 9, wherein the first latch node is connected to the first latch, the second latch node is connected to the second latch, and the first and second latch nodes are electrically connected through a transistor.

12. The operating method of claim 11, wherein the first latch node is charged to the first level if the transistor turns on after the pre-charging of the sensing node is started.

13. The operating method of claim 9, wherein the second bit line is pre-charged through the sensing node.

14. The operating method of claim 9, wherein the first latch node is electrically connected to a ground terminal through a transistor.

15. The operating method of claim 14, wherein the first latch node is pulled down to a ground voltage if the transistor turns on.

* * * * *